(12) United States Patent
Hyoudo et al.

(10) Patent No.: US 6,521,482 B1
(45) Date of Patent: Feb. 18, 2003

(54) MANUFACTURING METHOD FOR A SEMICONDUCTOR DEVICE

(75) Inventors: Haruo Hyoudo, Kiryu (JP); Shigeo Kimura, Gunma (JP); Takanori Shibasaki, Honjo (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/632,170

(22) Filed: Aug. 3, 2000

(30) Foreign Application Priority Data

Aug. 6, 1999 (JP) .......................................... 11-223410

(51) Int. Cl.[7] .......................... H01L 21/44; H01L 21/48; H01L 21/50
(52) U.S. Cl. ....................... 438/110; 438/108; 438/113; 438/114; 438/121; 438/123
(58) Field of Search ................................. 438/110, 108, 438/127, 613, 113, 616, 618, 612, 615, 114, 458, 464, 465, 106, 125, 112, 121, 122

(56) References Cited

U.S. PATENT DOCUMENTS

| | | | | |
|---|---|---|---|---|
| 5,866,942 A | * | 2/1999 | Suzuki et al. | 257/698 |
| 5,956,574 A | * | 9/1999 | Ichikawa et al. | 438/106 |
| 5,976,912 A | * | 11/1999 | Fukutomi et al. | 438/110 |

* cited by examiner

*Primary Examiner*—Matthew S. Smith
*Assistant Examiner*—Igwe U. Anya
(74) *Attorney, Agent, or Firm*—Wenderoth, Lind & Ponack, L.L.P.

(57) ABSTRACT

A method of manufacturing individual semiconductor devices by forming island sections 26 on the surface of a common substrate 21, forming electrodes 27 and 28 one on either side of each island section 26, die bonding a semiconductor chip 29 to each island section 26, and wire bonding the electrodes 27 and 28 to the semiconductor chip 29. A single common cover 36 is fixed over the entire surface of the common substrate 21 to form a hermetically sealed hollow space over each chip mounting section 41. The cover 36 and substrate 21 are separated at each mounting section 41 to form individual semiconductor devices.

16 Claims, 6 Drawing Sheets

MANUFACTURING METHOD FOR A SEMICONDUCTOR DEVICE

BACKGROUND OF THE INVENTION

1. Field of the Invention

The present invention relates to a manufacturing method for a semiconductor device having a high-frequency type semiconductor chip encapsulated in a hollow type hermetically sealed package.

2. Description of the Related Art

In some conventional semiconductor devices, a hollow type package is provided to encapsulate a semiconductor chip, which is designed to handle high frequencies in a package. This hollow type package reduces the interconnect capacitance of the device, since the dielectric constant in air is lower than that resulting in resin-sealed chips. Hence, this hollow type package design can improve the high-frequency characteristics of the device.

FIGS. 7A and 7B show an examplary construction of a conventional high-frequency semiconductor device, as described in Japanese laid-open patent publication No. 10-173117. This device includes a base substrate 1 formed of ceramic or the like; leads 2 for connecting external devices; a cap 3 also composed of ceramic or the like; a chip mounting section 4 disposed between the leads 2; a semiconductor chip 5 mounted on the surface of the mounting section 4; and bonding wires 6 connecting the semiconductor chip 5 to each of the leads 2. The semiconductor chip 5 is hermetically sealed within a package 7 formed by the cap 3.

When manufacturing this type of device, the leads 2 are supplied in the form of a lead frame. The semiconductor chip 5 is die-bonded and wire-bonded to the lead frame. Next, the base substrate 1 is affixed to the bottom surface of the lead frame. The cap 3 is affixed to the top of the base substrate 1 with the lead frame interposed therebetween. Finally, the lead frame is trimmed and reformed.

However, the shortcoming of this package design is that the leads 2 protrude from the base substrate 1. Accordingly, a large amount of area is required when mounting this package on a printed circuit board. Another problem of this manufacturing method is that the base substrate 1 and cap 3 must be fixed to the lead frame for each chip. Consequently, the manufacturing process is complex and not suitable for mass production.

SUMMARY OF THE INVENTION

In view of the foregoing, it is an object of the present invention to provide a manufacturing method suitable for the mass production of semiconductor devices each having a high-frequency type semiconductor chip encapsulated in a hermetically sealed hollow type package. It is another object of the present invention to provide a method of manufacturing the same type of semiconductor devices that do not require a large amount of area for mounting on a printed circuit board.

These objects and others will be attained by a manufacturing method for a semiconductor device, comprising: preparing a common substrate having opposing first and second main surfaces and a plurality of mounting sections formed at the first main surface, each of the mounting sections being provided with an island section for mounting a semiconductor chip and electrode sections disposed on opposing sides of the island section for connecting to the electrodes of the semiconductor chip; fixing a semiconductor chip onto each of the mounting sections; fixing a cover over the plurality of mounting sections for hermetically sealing each of the semiconductor chips, which is mounted in a hollow space formed thereby; and separating the mounting sections, each retaining their corresponding portions of cover and substrate to produce a semiconductor device having a hermetically sealed semiconductor chip.

The above and other objects, features, and advantages of the present invention will be apparent from the following description when taken in conjunction with the accompanying drawings which illustrates preferred embodiments of the present invention by way of example.

DETAILED DESCRIPTION OF THE PREFERRED EMBODIMENTS

A manufacturing method for a semiconductor device according to preferred embodiments of the present invention will be described while referring to the accompanying drawings.

The following is a description of each step in a manufacturing method for a semiconductor device according to the first embodiment.

Figure 1A:
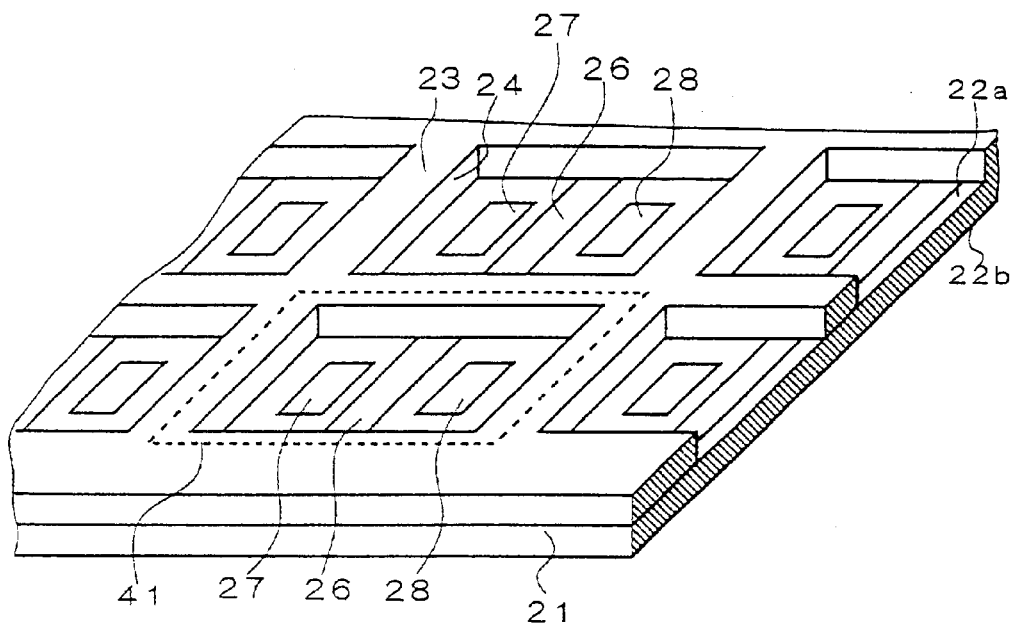
FIGS. 1A and 1B are perspective views showing the manufacturing process for a semiconductor device according to a first embodiment of the present invention.

Step 1: See FIG. 1A

First a large substrate 21 is prepared. The large substrate 21 is formed of an insulating material such as ceramic or glass epoxy and has a thickness of 100–500 $\mu$m. The substrate 21 has a first main surface 22a comprising the top surface and a second main surface 22b comprising the bottom surface. A lattice-like side portion (common side portion frame) 23 is formed of rail-like members having a height of 0.4 mm and a width of 0.5 mm and is disposed around the outer circumference of each chip mounting area on the substrate 21, forming depressions 24 in the centers of the mounting areas. In the present embodiment, a second substrate 21a is formed with a plurality of holes corresponding to the positions of the depressions 24. The depressions 24 are formed by affixing this second substrate 21a to the substrate 21, wherein both substrates have the thickness described above. However, the substrate 21 and second substrate 21a can also be provided as one integrally formed part.

Each of the depressions 24 has dimensions of approximately 0.8×0.6 mm. The depressions 24 are arranged on the substrate 21 at regular intervals both longitudinally and latitudinally. A plurality of groups each including an island 26 and electrodes 27 and 28 are formed of conductive patterns on the first main surface 22a using such material as gold plating, wherein one group is disposed in each depression 24. The island 26 extends across the center of the depression 24 in the shape of a belt separating the electrodes 27 and 28. Each depression 24 and a portion of the side portion 23 surrounding the depression 24 form a chip mounting section 41.

Figure 1B:
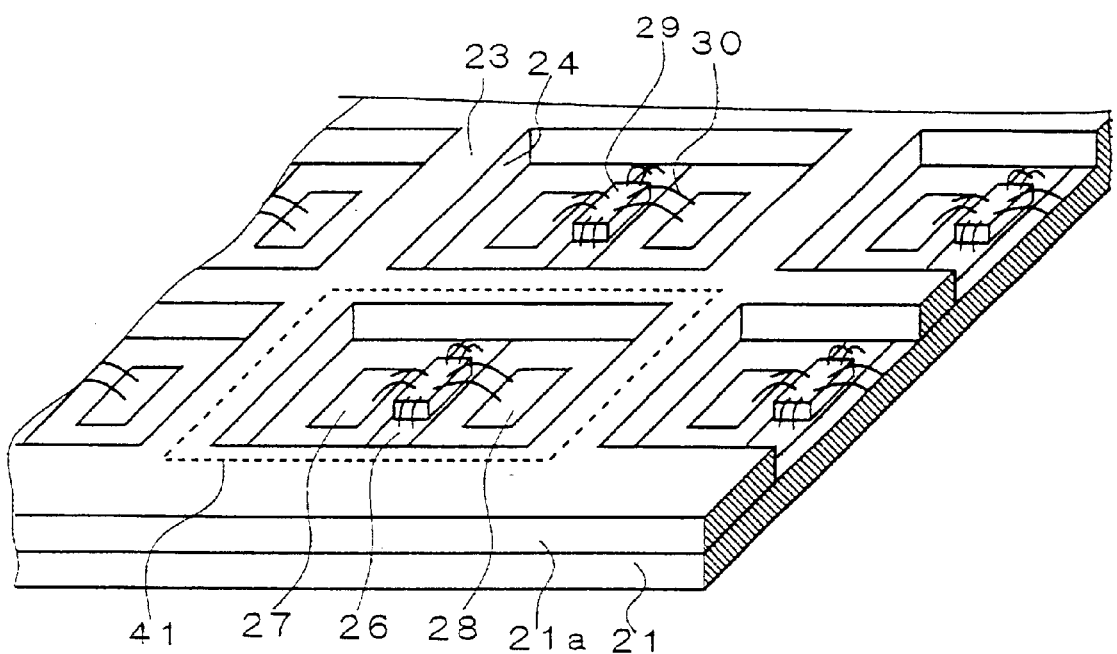

Step 2: See FIG. 1B

After manufacturing the substrate 21 as described above, a semiconductor chip 29 is die-bonded to the island 26 in each depression 24. Bonding wires 30 are wire-bonded to the semiconductor chip 29 and each of the electrodes 27 and 28. The height of the loop formed by the bonding wires 30 should be less than the height of the side portion 23. When forming the substrate 21 and second substrate 21a separately, the second substrate 21a should be affixed to the substrate 21 after the die-bonding and wire-bonding processes have been performed.

Figure 2A:
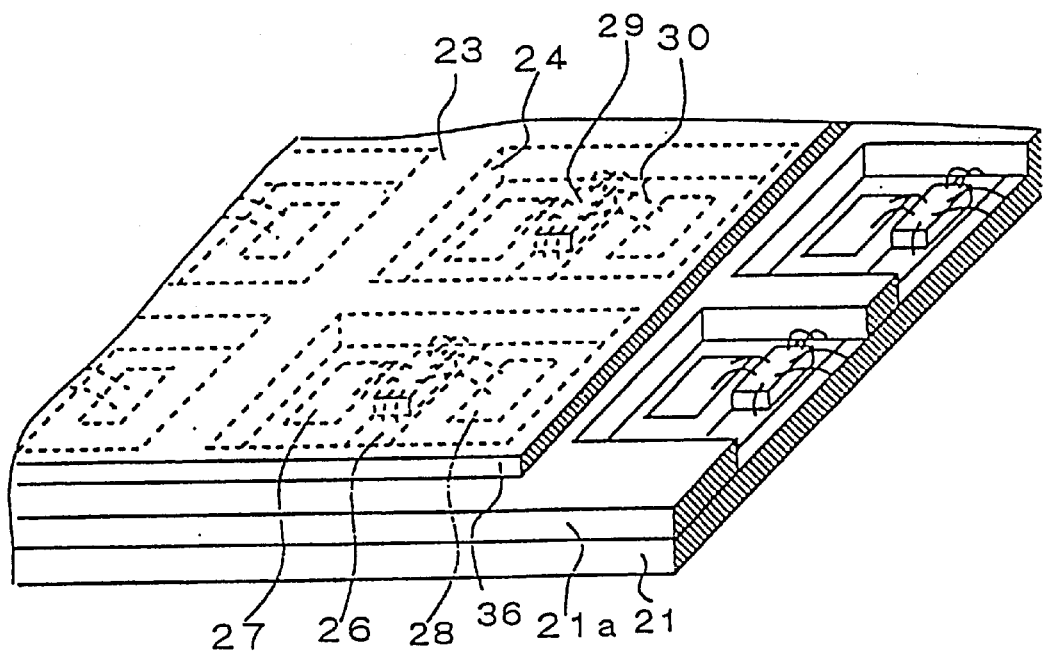
FIGS. 2A and 2B are perspective views showing the manufacturing process for the semiconductor device according to the first embodiment.

Step 3: See FIG. 2A

One plate-shaped cover member 36 is prepared. The cover member 36 has a thickness of approximately 0.15–0.25 mm and is formed of a ceramic or an organic insulating material. The cover member 36 is bonded to the top of the side portion 23 to span the entire plurality of chip mounting sections 41 and hermetically seal each of the depressions 24. An epoxy adhesive or the like is used to bond the cover member 36 to the side portion 23. With this construction the semiconductor chip 29 and bonding wires 30 are contained within a completely airtight hollow space.

Figure 2B:
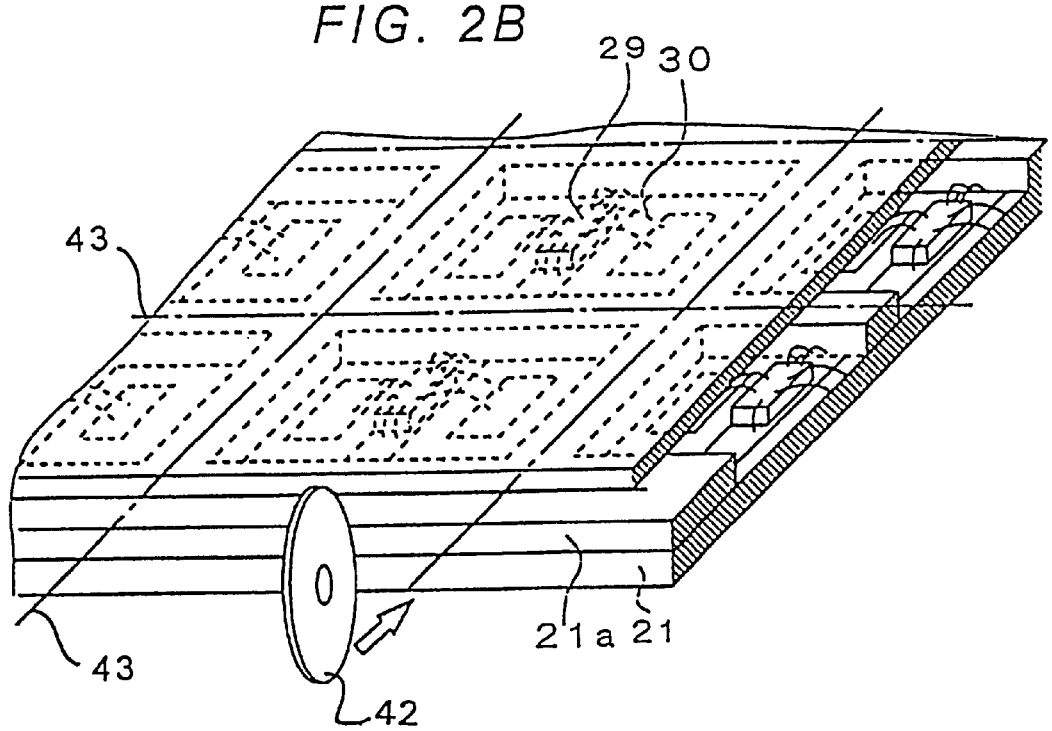

Step 4: See FIG. 2B

Each of the chip mounting sections 41 is separated by cutting along the guide marks on the surface of the substrate 21 to obtain individual devices. A dicing plate 42 is used to separate the chip mounting sections 41. The process is conducted by fixing a dicing sheet to the bottom surface of the substrate 21 (second main surface 22b) and cutting through the substrate 21 and cover member 36 along longitudinal and latitudinal dicing lines 43 using the dicing plate 42. The dicing lines 43 are positioned along the center of the side portion 23. It is also possible to attach a dicing sheet to the cover member 36.

Figure 3A:
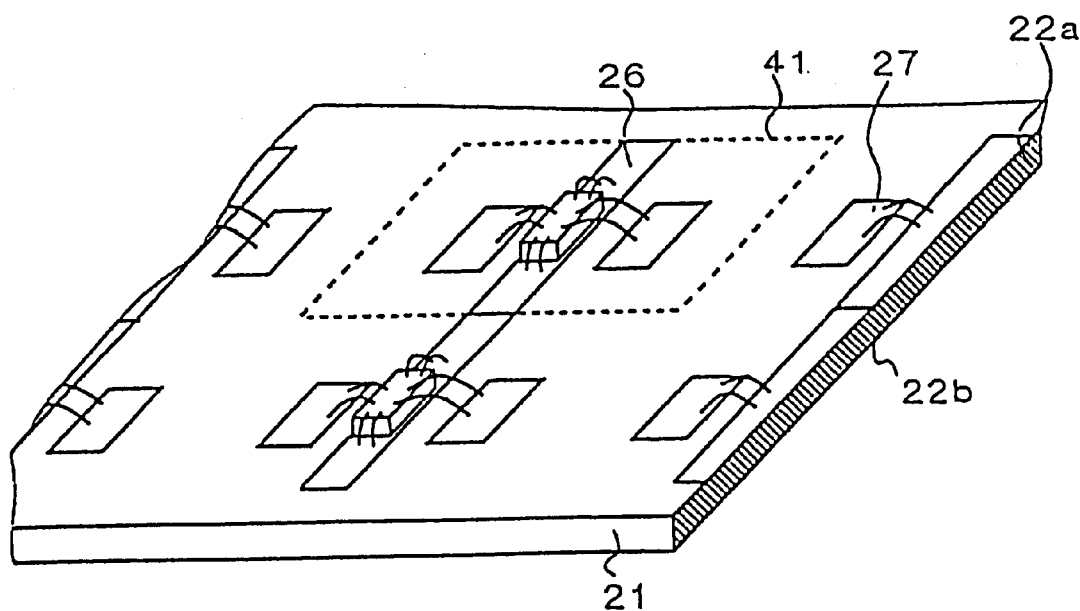
FIGS. 3A and 3B are perspective views showing the manufacturing process for the semiconductor device according to a second embodiment of the present invention.
Figure 3B:
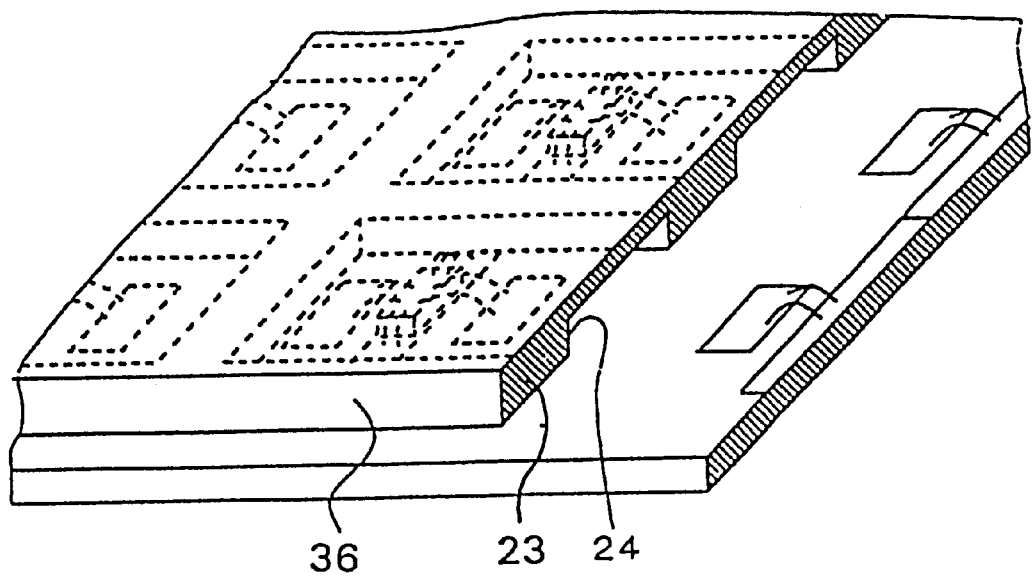

FIGS. 3A and 3B show the manufacturing method for a semiconductor device according to a second embodiment of the present invention. In this embodiment, the side portion 23 is integrally formed with the cover member 36.

Step 1: See FIG. 3A

First a large substrate 21 is prepared. The large substrate 21 is formed of an insulating material such as ceramic or glass epoxy and has a thickness of 0.1–0.5 mm. The substrate 21 has a first main surface 22a comprising the top surface and a second main surface 22b comprising the bottom surface. A plurality of groups comprising an island 26 and electrodes 27 and 28 are formed on the first main surface 22a using a conductive pattern formed of such material as gold plating. The area surrounding the island 26 and the electrodes 27 and 28 is the chip mounting section 41. Chip mounting sections 41 are arranged at equal intervals from each other longitudinally and latitudinally. The island 26 extends across the center of the depression 24 in the shape of a belt separating the electrodes 27 and 28.

After preparing a substrate 21 with the configuration described above, a semiconductor chip 29 is die-bonded on the island 26 in each chip mounting section 41 and bonding wires 30 are wire-bonded to the semiconductor chip 29 and each of the electrodes 27 and 28.

Step 2: See FIG. 3B

Next, a cover member 36 is prepared. The cover member 36 has a thickness of approximately of 0.1–0.3 mm and is formed of ceramic or an organic insulating material. The lattice-shaped side portion 23 having a height of approximately 0.1–0.2 mm and a width of 0.2–0.5 mm is integrally formed with the cover member 36 to form a plurality of depressions 24. With this construction, the depressions 24 face the first main surface 22a and surround each of the chip mounting sections 41. The depressions 24 are approximately 0.8×0.6 mm in size and are arranged at equal intervals from each other longitudinally and latitudinally.

After completing the die-bonding and wire-bonding processes, the cover member 36 is bonded to the substrate 21 such that the depression 24 is hermetically sealed for each of the chip mounting sections 41. An epoxy adhesive or the like is used to bond the cover member 36 to the substrate 21. As a result of this process, the semiconductor chip 29 and bonding wires 30 are contained within a completely airtight hollow space. Since the die-bonding and wire-bonding can be performed on the substrate 21 in the present embodiment, there is no need for an adsorption collet or bonding tool to contact the side portion 23. Accordingly, the depressions 24 can be constructed with smaller dimensions.

Step 3: (Not Shown)

As described in the first embodiment, each of the chip mounting sections 41 is separated by cutting along the guide marks to obtain individual devices (not shown). A dicing plate 42 is used to separate the chip mounting sections 41. The process is conducted by fixing a dicing sheet to the bottom surface of the substrate 21 (second main surface 22b) and cutting through the substrate 21 and cover member 36 along longitudinal and latitudinal dicing lines 43 using the dicing plate 42. The dicing lines 43 are positioned along the center of the side portion 23. It is also possible to attach a bonding sheet to the cover member 36.

Figure 4:
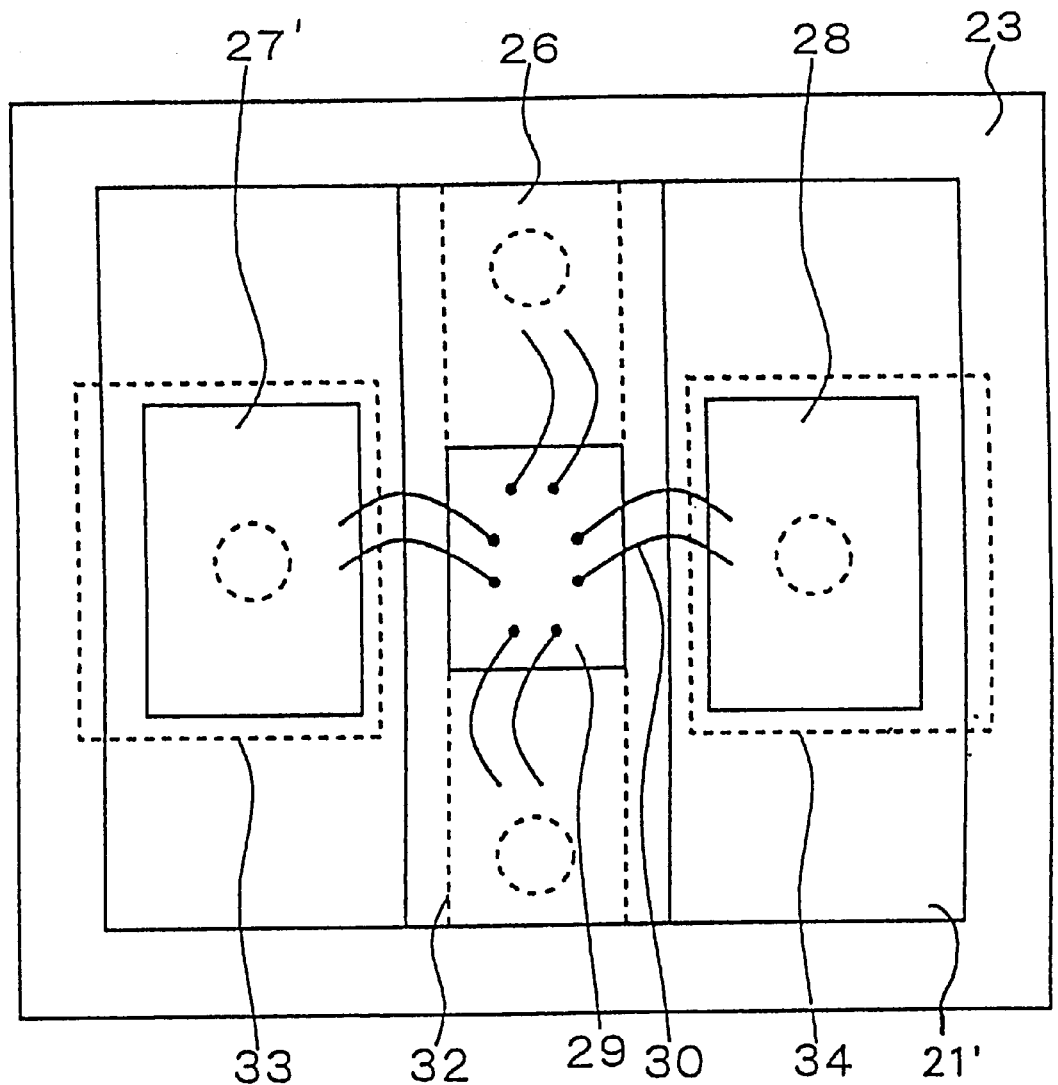
FIG. 4 is a plan view showing the manufacturing process for the semiconductor device of the first embodiment.
Figure 5:
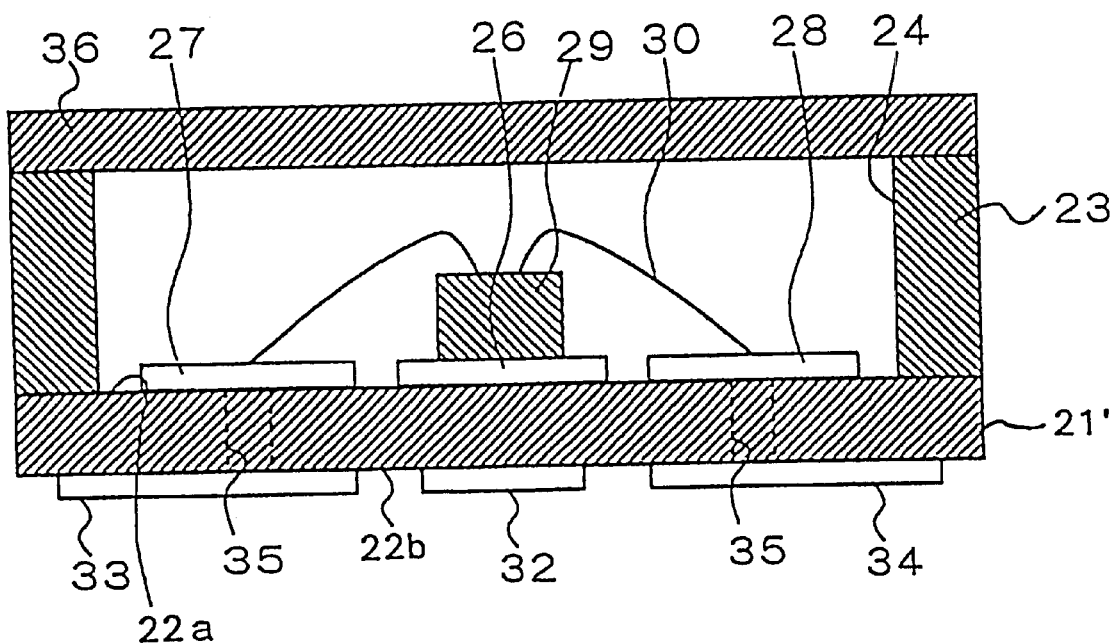
FIG. 5 is a cross-sectional view showing the manufacturing process for the semiconductor device of the first embodiment.
Figure 6:
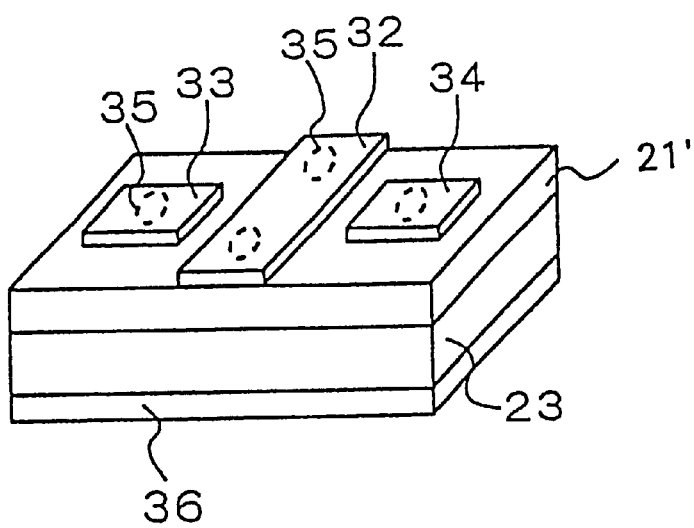
FIG. 6 is a perspective view showing the manufacturing process for the semiconductor device of the first embodiment.
Figure 7A:
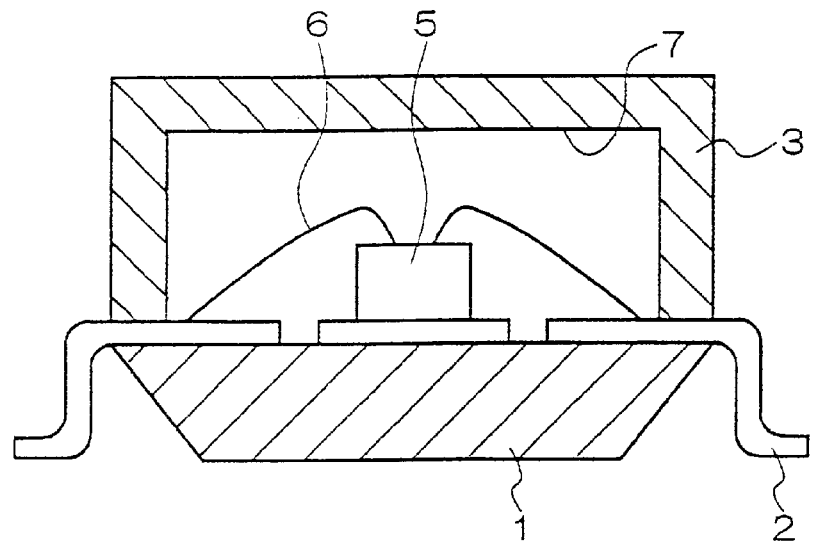
FIG. 7A is a cross-sectional view and 7B is a plan view showing a manufacturing process for a conventional semiconductor device.
Figure 7B:
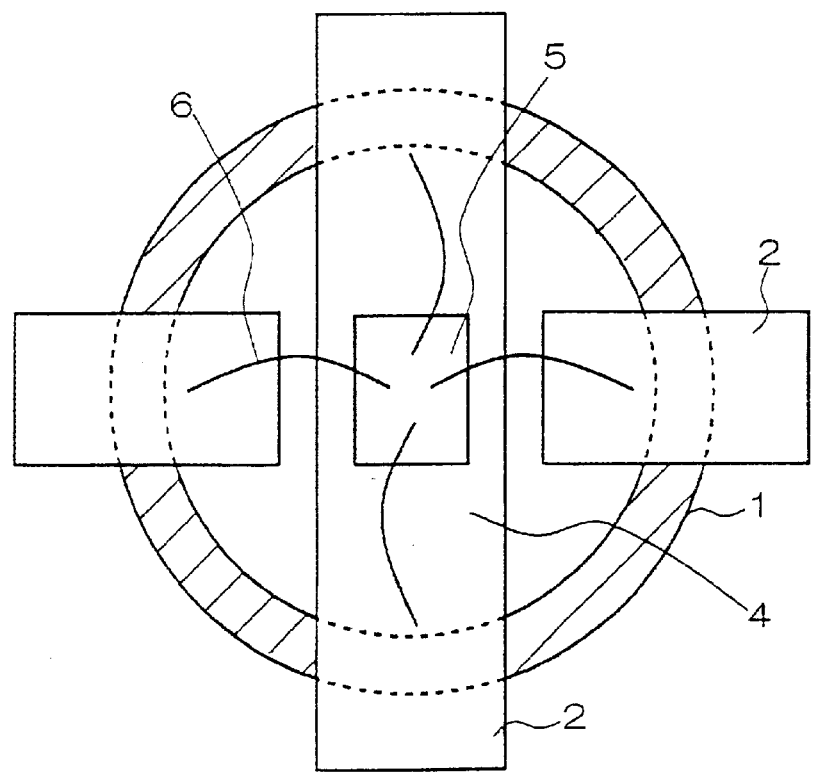

FIGS. 4 and 5 are plan and cross-sectional views showing a high-frequency semiconductor device manufactured according to the first embodiment. FIG. 6 is a perspective view from the bottom side of the device.

From the plan view shown in FIG. 4, a substrate 21' separated from the substrate 21 has a rectangular shape with dimensions of approximately 1.5×2.5 mm.

The high-frequency semiconductor chip 29 die-bonded to the island 26 of the substrate 21' is, for example, a Schottky barrier diode, MMIC, GaAsFET, or the like. The electrode pads formed on the surface of the semiconductor chip 29 are connected to the electrodes 27 and 28 by the bonding wires 30. Since the island 26 is formed in a belt shape between the electrodes 27 and 28, an FET using the island 26 as a source achieves a reduced stray capacity between the gate electrode 27 and the drain electrode 28.

External connectors 32, 33, and 34 are formed on the second main surface 22b of the substrate 21' by conductive patterns formed of gold plating or the like. The external connectors 32, 33, and 34 approximate the pattern of the island 26, and electrodes 27 and 28. Via holes 35 corresponding to each of the external connectors 32, 33, and 34 penetrate the substrate 21' from the first main surface 22a to the second main surface 22b. The via holes 35 are filled with a conducting material such as tungsten, silver, copper, or the like, electrically connecting the island 26 to the external connector 33, the electrode 27 to the external connector 32, and the electrode 28 to the external connector 34. The edges of the external connectors 32, 33, and 34 are set back approximately 0.1–0.2 mm from the edges of the substrate 21'. It is desirable for the bonding wires 30 to be connected to the electrodes 27 and 28 directly over the via holes 35. The external connectors 32, 33, and 34 are preformed on the large substrate 21.

After being cut in the dicing process, the side portion 23 surrounds the semiconductor chip 29, and a cover member 36 seals the semiconductor chip 29 in an airtight hollow space. An adhesive is used to bond the side portions 23 to the first main surface 22a and the side portions 23 to the cover member 36. As a result, the semiconductor chip 29 and the fine metallic wires 30 are contained within the airtight hollow space formed by the depression 24. Cutting the substrate 21, side portions 23, and cover member 36 in the dicing process forms a flat surface on the outer side faces of the same.

The electronic part described above is mounted such that the external connectors 32, 33, and 34 are bonded directly opposite the electrode patterns on the mounting substrate. With this construction, the electrode 32 functions as a shield between the connectors 33 and 34.

The manufacturing process of the present invention described above, in which multiple electronic parts are manufactured on a large substrate 21, is simpler than processes in which electronic parts are manufactured individually. Therefore, the production cost per package is cheaper. Further, the leads do not protrude externally from the device, allowing its mounting surface to be reduced for mounting on a printed circuit board.

In the embodiments described above, the semiconductor device is manufactured by cutting an encapsulating package suitable for a high-frequency chip from a common substrate wafer. This procedure simplifies the manufacturing process and reduces the external size of the device, thereby reducing production costs.

Further, by disposing an island section in a stripe pattern between the two electrodes, the island can readily function as a shield between the electrodes, serving as the gate and drain, when mounting an FET chip or the like.

Although certain preferred embodiments of the present invention have been shown and described in detail, it should be understood that various changes and modifications may be made therein without departing from the scope of the appended claims.

What is claimed is:

1. A method of manufacturing semiconductor devices, comprising:
   preparing a common substrate plate having opposing first and second main surfaces and being formed of an insulating material, a plurality of mounting areas being provided at said first main surface, each of said mounting areas being provided with an island section for mounting a semiconductor chip and electrode sections for connecting electrodes of the semiconductor chip, said second main surface being provided with a plurality of external connecting electrodes connected to said island sections and said electrode sections, respectively;
   fixing a semiconductor chip on each of said island sections;
   fixing a common cover member over said mounting areas so that said semiconductor chips are respectively disposed in hermetically sealed hollow spaces defined between said cover member and said common substrate plate; and
   cutting through said common substrate plate and said common cover member to separate said common substrate plate and said common cover member into plural semiconductor devices having said semiconductor chips disposed in said hermetically sealed hollow spaces, respectively, between individual substrate plates and individual cover members, respectively.

2. A method as claimed in claim 1, wherein, in said preparing of said common substrate plate, said common substrate plate is provided with a plurality of depressions at said first main surface, each of said depressions containing one of said mounting areas and defining one of said hollow spaces.

3. A method as claimed in claim 2, wherein said common cover member comprises a common cover member plate.

4. A method as claimed in claim 1, wherein said common cover member is provided with a plurality of depressions arranged such that, after said cover member is fixed to said common substrate plate, each of said depressions contains one of said mounting areas and defines one of said hollow spaces.

5. A method as claimed in claim 4, wherein said common cover member comprises a common cover member plate.

6. A method as claimed in claim 1, wherein said common cover member comprises a common cover member plate.

7. A method as claimed in claim 1, wherein, in said preparing of said common substrate plate, said common substrate plate is prepared such that, for each of said mounting areas, said electrode sections are disposed on opposing sides of said island section.

8. A method as claimed in claim 1, wherein, in said preparing of said common substrate plate, said common substrate plate is prepared such that, for each of said mounting areas, said island section extends across an approximate center of said mounting area and is disposed between said electrode sections.

9. A method as claimed in claim 1, wherein, in said preparing of said common substrate plate, said external connecting electrodes are respectively connected to said island sections and said electrode sections through via holes formed in said common substrate plate.

10. A method as claimed in claim 1, wherein said cutting of said common substrate plate and said common cover member comprises a dicing process.

11. A method as claimed in claim 1, wherein said preparing of said common substrate plate and said cutting of said common substrate plate and said common cover member are carried out such that, for each of said semiconductor devices, each of said external connecting electrodes is set back from an edge of said semiconductor device.

12. A method as claimed in claim 1, wherein said preparing of said common substrate plate and said cutting of said common substrate plate and said common cover member are carried out such that, for each of said semiconductor devices, each of said external connecting electrodes is set back 0.1–0.2 mm from an edge of said semiconductor device.

13. A method as claimed in claim 1, wherein said preparing of said common substrate plate and said cutting of said common substrate plate and said common cover member are carried out such that, for each of said semiconductor devices, each of said external connecting electrodes does not extend sideways outwardly from said semiconductor device.

14. A method as claimed in claim 1, further comprising providing a common side portion frame that forms sidewalls of said hollow spaces.

15. A method as claimed in claim 14, wherein said providing of said common side portion frame comprises providing a second substrate having a lattice structure to be disposed between said common cover member and said first main surface of said common substrate plate.

16. A method as claimed in claim 14, wherein said common side portion frame is formed as an integral part of said common cover member.

* * * * *